United States Patent
Chu et al.

(10) Patent No.: US 10,256,783 B2
(45) Date of Patent: Apr. 9, 2019

(54) DUAL-MODE RF TRANSMISSION FRONTEND

(71) Applicant: Taiwan Semiconductor Manufacturing Co., Ltd., Hsin-Chu (TW)

(72) Inventors: Hong-Lin Chu, Hsinchu (TW); Hsieh-Hung Hsieh, Taipei (TW); Tzu-Jin Yeh, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/714,395

(22) Filed: Sep. 25, 2017

(65) Prior Publication Data

US 2018/0212568 A1    Jul. 26, 2018

Related U.S. Application Data

(60) Provisional application No. 62/427,501, filed on Nov. 29, 2016.

(51) Int. Cl.
| | |
|---|---|
| *H03F 3/72* | (2006.01) |
| *H04B 1/04* | (2006.01) |
| *H03C 1/36* | (2006.01) |

(52) U.S. Cl.
CPC ............... *H03F 3/72* (2013.01); *H03C 1/36* (2013.01); *H04B 1/0483* (2013.01); *H03F 2200/294* (2013.01); *H03F 2200/541* (2013.01); *H03F 2203/72* (2013.01); *H03F 2203/7209* (2013.01); *H04B 2001/0408* (2013.01)

(58) Field of Classification Search
CPC ... H04B 1/0483; H04B 2001/045; H03F 3/72; H03F 2203/72; H03F 2203/7203; H03F 2203/7206; H03F 2203/7227
See application file for complete search history.

(56) References Cited

U.S. PATENT DOCUMENTS

| | | | | |
|---|---|---|---|---|
| 7,944,296 B1* | 5/2011 | Lee | ..................... | H03F 1/0277 330/154 |
| 2006/0135079 A1* | 6/2006 | Barnett | ................ | H04B 7/0608 455/69 |
| 2007/0018720 A1* | 1/2007 | Wright | .................. | H03F 1/0244 330/51 |
| 2007/0080750 A1* | 4/2007 | Liebenrood | ........... | H03F 1/0261 330/252 |
| 2007/0149237 A1* | 6/2007 | Russell | ................. | H04W 52/28 455/522 |
| 2009/0278609 A1* | 11/2009 | Srinivasan | ............ | H03F 1/0216 330/297 |

(Continued)

*Primary Examiner* — Duc M Nguyen
(74) *Attorney, Agent, or Firm* — Duane Morris LLP

(57) ABSTRACT

A transmission frontend includes a modulator configured to generate a modulated signal. A first selectable path is electrically coupled to the modulator and is configured to generate a first signal having a first power level. A second selectable path is electrically coupled to the modulator and is configured to generate a second signal having a second power level. The first power level is greater than the second power level. A transformer is electrically coupled to each of the first selectable path and the second selectable path. An antenna is electrically coupled to the transformer.

18 Claims, 9 Drawing Sheets

(56) References Cited

U.S. PATENT DOCUMENTS

| | | | | |
|---|---|---|---|---|
| 2010/0127780 A1* | 5/2010 | An | .................. | H03F 1/0266 330/295 |
| 2012/0009968 A1* | 1/2012 | Kludt | .................. | H04B 7/0689 455/522 |
| 2013/0183917 A1* | 7/2013 | Asuri | .................. | H04B 1/0483 455/127.5 |
| 2014/0009233 A1* | 1/2014 | Cabrera | .................. | H03F 1/0277 330/273 |
| 2014/0068116 A1* | 3/2014 | Kim | .................. | G06F 13/14 710/33 |
| 2015/0050901 A1* | 2/2015 | Lee | .................. | H03F 1/0277 455/127.3 |
| 2017/0093339 A1* | 3/2017 | Wu | .................. | H03F 1/0216 |

* cited by examiner

DUAL-MODE RF TRANSMISSION FRONTEND

CROSS-REFERENCE TO RELATED APPLICATIONS

This application claims benefit to U.S. Provisional Appl. Ser. No. 62/427,501, filed Nov. 29, 2016, entitled "DUAL-MODE RF TRANSMISSION FRONTEND," which is incorporated herein in its entirety.

FIELD

This disclosure related to radiofrequency (RF) transmission (TX) frontends, and more specifically, to RF TX frontends configured for transmission protocols having two or more power levels.

BACKGROUND

Several short-range communication protocols have been developed to provide wireless communication between electronic devices, such as near-field communication (NFC), Bluetooth™ (BT), Bluetooth Low Energy (BLE), etc. Short-range communication protocols each operate in predetermined frequencies and generally have a predetermined power configured to provide short-range transmission. For example, BT operates substantially in the 2400-2483.5 MHz range within the ISM 2.4 GHz frequency band. As another example, BLE is a modified form of BT communication that remains in sleep mode except when a connection is initiated. As yet another example, NFC provides communication in a 13.56 MHz band (as defined by ISO/IEC standard 18092).

Current TX frontends are configured to optimize one of a high-power transmission or a low-power transmission. For example, high-power frontends provide poor power efficiency for low-power signals, such as BLE signals. Simultaneously, low-power frontends designed to optimize power efficiency of low-power signals, such as BLE signals, cannot provide output power for standard high-power transmission. Current solutions provide optimization of only one of two possible operating modes, low-power or high-power.

BRIEF DESCRIPTION OF THE DRAWINGS

Aspects of the present disclosure are best understood from the following detailed description when read with the accompanying figures. It is noted that, in accordance with the standard practice in the industry, various features are not necessarily drawn to scale. In fact, the dimensions of the various features may be arbitrarily increased or reduced for clarity of discussion.

DETAILED DESCRIPTION

Aspects of the present disclosure are best understood from the following detailed description when read with the accompanying figures. It is noted that, in accordance with the standard practice in the industry, various features are not necessarily drawn to scale. In fact, the dimensions of the various features may be arbitrarily increased or reduced for clarity of discussion. Terms concerning attachments, coupling and the like, such as "connected," "interconnected," "electrically connected," and "electrically coupled" refer to a relationship wherein structures are electrically attached or coupled to one another, either directly or indirectly through intervening circuit elements, as well as both wired or wireless attachments or relationships, unless expressly described otherwise.

In various embodiments, a dual-mode radiofrequency transmission frontend having a high-power path and a low-power path is disclosed. The TX frontend includes an input configured to receive a signal from one or more additional circuit elements. The input is coupled to a modulator configured to provide modulation of the input signal. The modulator is coupled to each of the high-power path and the low power path. The high-power path includes one or more circuit elements configured to provide a high-power output signal corresponding to a first transmission protocol having a first power. The low-power path includes one or more circuit elements configured to provide a low-power output signal corresponding to a second transmission protocol having a second power. In some embodiments, the second transmission protocol is a low-power version of the first transmission protocol. In some embodiments, each of the high-power path and the low-power path are coupled to an antenna.

Figure 1:
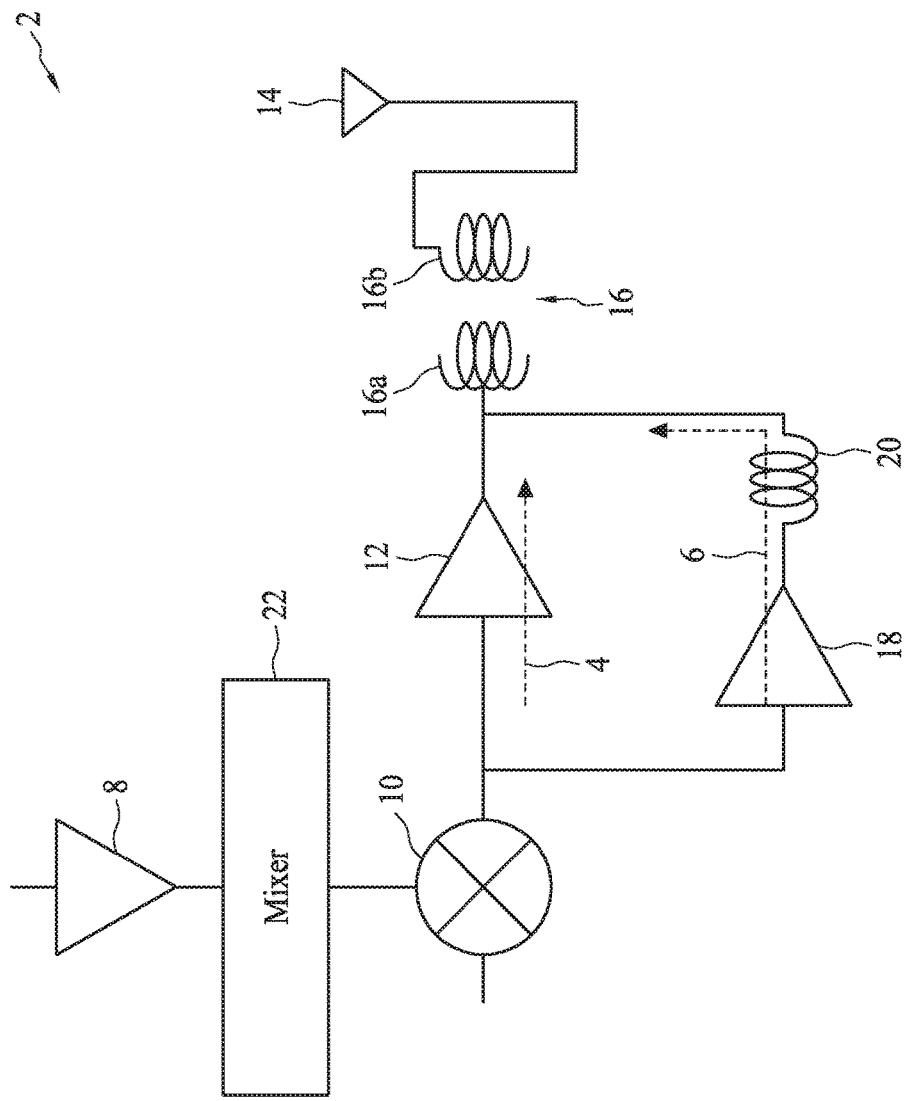
FIG. 1 illustrates a dual-mode TX frontend including a first high-power transmission path and a second, low-power transmission path, in accordance with some embodiments.

FIG. 1 illustrates a dual-mode RF TX frontend 2 including a first, high-power path 4 and a second, low-power path 6 in accordance with some embodiments. The dual-mode RF TX frontend 2 receives an input signal at an input 8. The input signal can be generated by one or more additional circuits and/or circuit elements (not shown) coupled to the input 8. For example, in some embodiments, the dual-mode RF frontend 2 is coupled to one or more circuit elements of a System-On-Chip (SOC) device. The dual-mode RF frontend 2 can be integrated with the SOC device and/or electrically coupled to the SOC. In some embodiments, the input 8 includes an amplifier configured to amplify the input signal to a first predetermined power level.

In some embodiments, the input signal is provided from the input 8 to a mixer 22. The mixer 22 is configured to mix the input signal with one or more additional signals to generate a mixed signal. In some embodiments, the mixed signal is generated by modifying the frequency of the input signal. For example, the mixer 22 can include a frequency mixer, such as, for example, a local oscillator, configured to combine a predetermined frequency signal with the input signal to modify the frequency of the input signal. The mixer 22 can be configured to mix the input signal with one or more carrier and/or predetermined frequency signals to generate a signal suitable for modulation by a modulator 10. In some embodiments, the mixed signal has a predetermined frequency configured for one or more wireless protocols, such as, for example, a frequency corresponding to BT/BLE transmission, NFC transmission, and/or one or more other wireless protocols.

The mixed signal (or the input signal in embodiments omitting the mixer 22) is provided to a modulator 10. The modulator 10 can include any suitable signal modulator, such as an amplitude-modulator, a quadrature amplitude modulator, a phase-shift keying modulator, a minimum shift keying modulator, a Gaussian frequency-shift keying modulator, a differential quadrature phase shift keying (DQPSK) modulator, a π/4-DPQSK modulator, an 8-DPQSK modulator, and/or any other suitable modulator. The modulator 10 generates a one or more modulated signals. For example, in some embodiments, the modulator 10 is a quadrature modulator configured to generate a quadrature amplification modulation (QAM) signal. The modulated signal is provided to one of a high-power path 4 and/or a low-power path 6.

In some embodiments, the high-power path 4 is configured to generate a high-power signal configured for transmission in accordance with a first transmission protocol, such as BT protocol, an NFC protocol, and/or any other suitable transmission protocol. The high-power path 4 includes one or more circuit elements configure to convert the modulated signal from a first power level received from the modulator 10 to a second power level corresponding to a predetermined power level of the first transmission protocol. For example, in some embodiments, the high-power path 4 includes a high-power power-amplifier 12. The high-power power-amplifier 12 is configured to convert the modulated signal from a first power level to a second power level, greater than the first power level. The high-power amplifier 12 can be configured to boost the input received from the modulator 10 to any suitable level. For example, in some embodiments, the high-power amplifier 12 is configured to provide an amplification of about 10 dB, although it will be appreciated that other amplifications are within the scope of this disclosure. In some embodiments, the high-power amplifier 12 is an operational amplifier. The high-power amplifier 12 is electrically coupled to a transformer 16.

In some embodiments, the low-power path 6 is configured to generate a low-power signal suitable for transmission according to a second transmission protocol having a lower transmission power than the first protocol. For example, in some embodiments, the second transmission protocol is a low-power version of the first transmission protocol, such as BLE protocol. The low-power path 6 includes one or more circuit elements configured to convert the modulated signal from the first power level to a third power level. The third power level is less than the second power level generated by the high-power path 4. For example, in some embodiments, the low-power path 6 includes a low-power amplifier 18 and an impedance booster 20. The low-power amplifier 18 is configured to provide amplification of a signal received from the modulator 10 to a third power level.

In some embodiments, low-power path 6 is configured to maintain the same power level as the output of the modulator 10 (e.g., the first power level and the third power level are equal). For example, in some embodiments, the low-power amplifier 18 is configured to provide an amplification of about 0 dB (e.g., no amplification), and instead functions as a switch to control the low-power path 6. The output of the amplifier 18 is provided to the impedance booster 20. The impedance booster 20 is coupled to the transformer 16 and is configured to increase the impedance of a first side 16a of the transformer 16. For example, in some embodiments, the impedance booster 20 is an inductor in series with the first side 16a of the transformer 16. The increased inductance of the first side 16a compensates for the lower power level of the low-power path 6 when converting the low-power signal to a signal suitable for transmission in a BT/BLE frequency.

The high-power path 4 and the low-power path 6 are selectively controlled such that only one of the high-power signal or the low-power signal are provided to the transformer 16. In various embodiments, each of the high-power path 4 and the low-power path 6 can include one or more circuit elements configured to selectively enable the respective path 4, 6. For example, in some embodiments, each of the high-power path 4 and/or the low-power path 6 can include a switch configured to control operation of the respective path 4,6. In some embodiments, one or more elements of each of the high-power path 4 and the low-power path 6 are configured to receive one or more signals, such as a selector signal and/or a variable power signal, to selectively control the associated circuit elements.

For example, in some embodiments, the high-power amplifier 12 receives a first input voltage (not shown) and the low-power amplifier 18 receives a second input voltage (now shown). For example, when a high-power transmission is desired, the first input voltage is set to a predetermined value sufficient to provide a first predetermined amplification of the modulated signal. For example, the first input voltage can be set to about 1.5 V during operation to provide a first amplification power. The first amplification power can be any suitable amplification power, such as an amplification of about 5 to 15 dBm, for example, 10 dBm. The second input voltage is set to 0 V, which prevents the low-power amplifier 18 from amplifying the modulated signal. Similarly, in another example, when BLE transmission is desired, the second input voltage is set to a second predetermined value and the first input voltage is set to zero. For example, the second input voltage can be set to about 0.8 V during operation to provide a second amplification power, such as an amplification of about −5 to 5 dBm, for example, 0 dBm. Although specific examples are provided herein, it will be appreciated that other predetermined voltages and/or amplification powers can be selected and are within the scope of this disclosure. In some embodiments, the first input voltage and the second input voltage can have the same set voltage value.

The selected one of the high-power path 4 or the low-power path 6 provides an amplified signal to the transformer 16. The transformer 16 is configured to convert the amplified signal received at a first side 16a of the transformer 16 to a transmission signal at a second side 16b. In some embodiments, the transmission signal is a signal in the BT/BLE frequency range. In some embodiments, the transformer 16 has a first impedance on a first side 16a and a second impedance on a second side 16b configured to transform from a first frequency of the amplified signal to a second, predetermined frequency of the transmission signal (e.g., an impedance boosting topology). The second side of the transformer 16 is coupled to an antenna 14. The transformer 16 can include any suitable transformer, such as, for example, a balun transformer.

The antenna 14 is configured to transmit the transmission signal at the predetermined frequency. For example, in some embodiments, the antenna 14 is configured to transmit a high-power BT signal and/or a low-power BLE signal. In some embodiments, the antenna 14 is a dedicated antenna. In other embodiments, the antenna 14 is a shared antenna and is shared by one or more additional transmission and/or receive frontends (not shown) coupled to one or more additional and/or alternative circuit elements.

Figure 8:
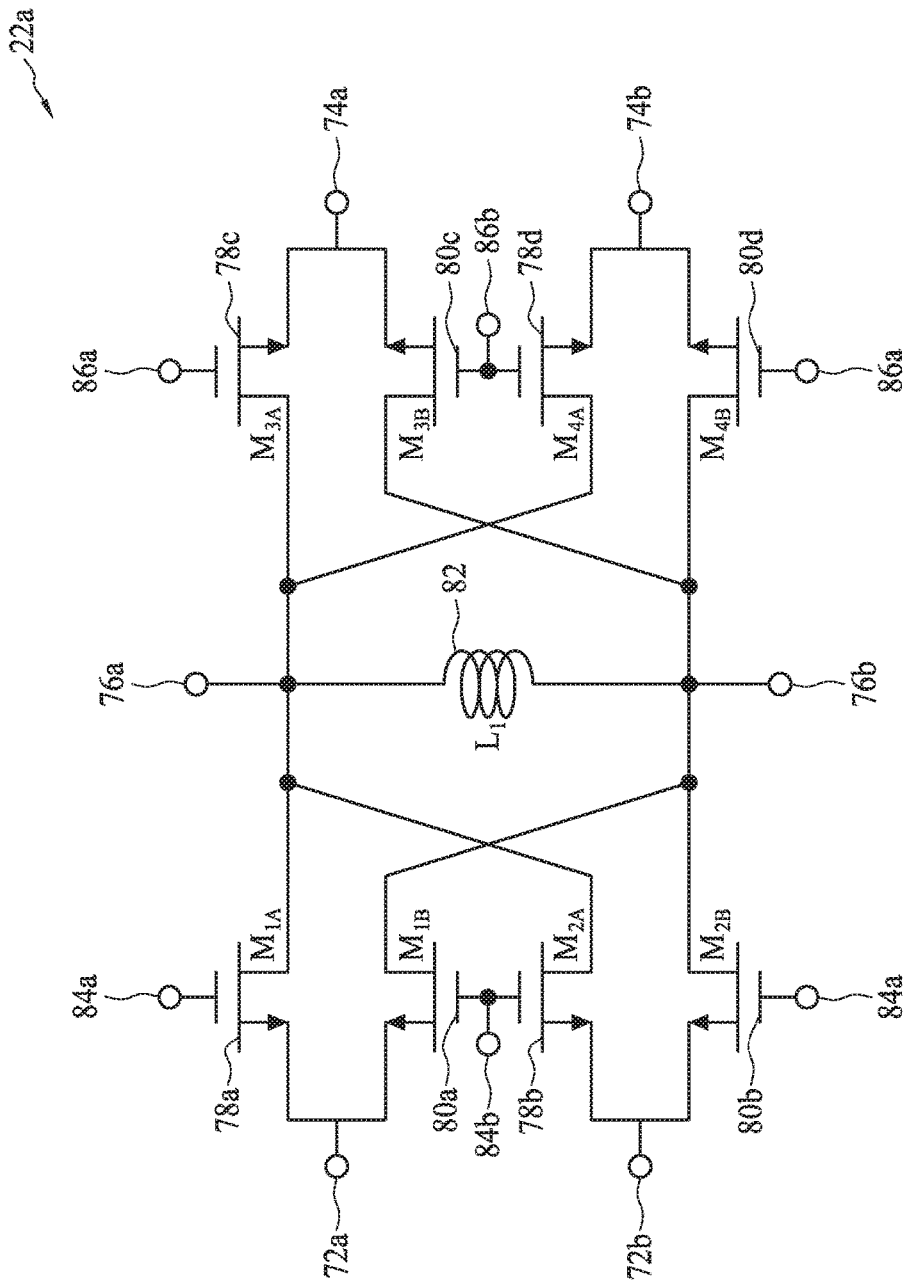
FIG. 8 illustrates a passive I/Q up-conversion mixer, in accordance with some embodiments.
Figure 9:
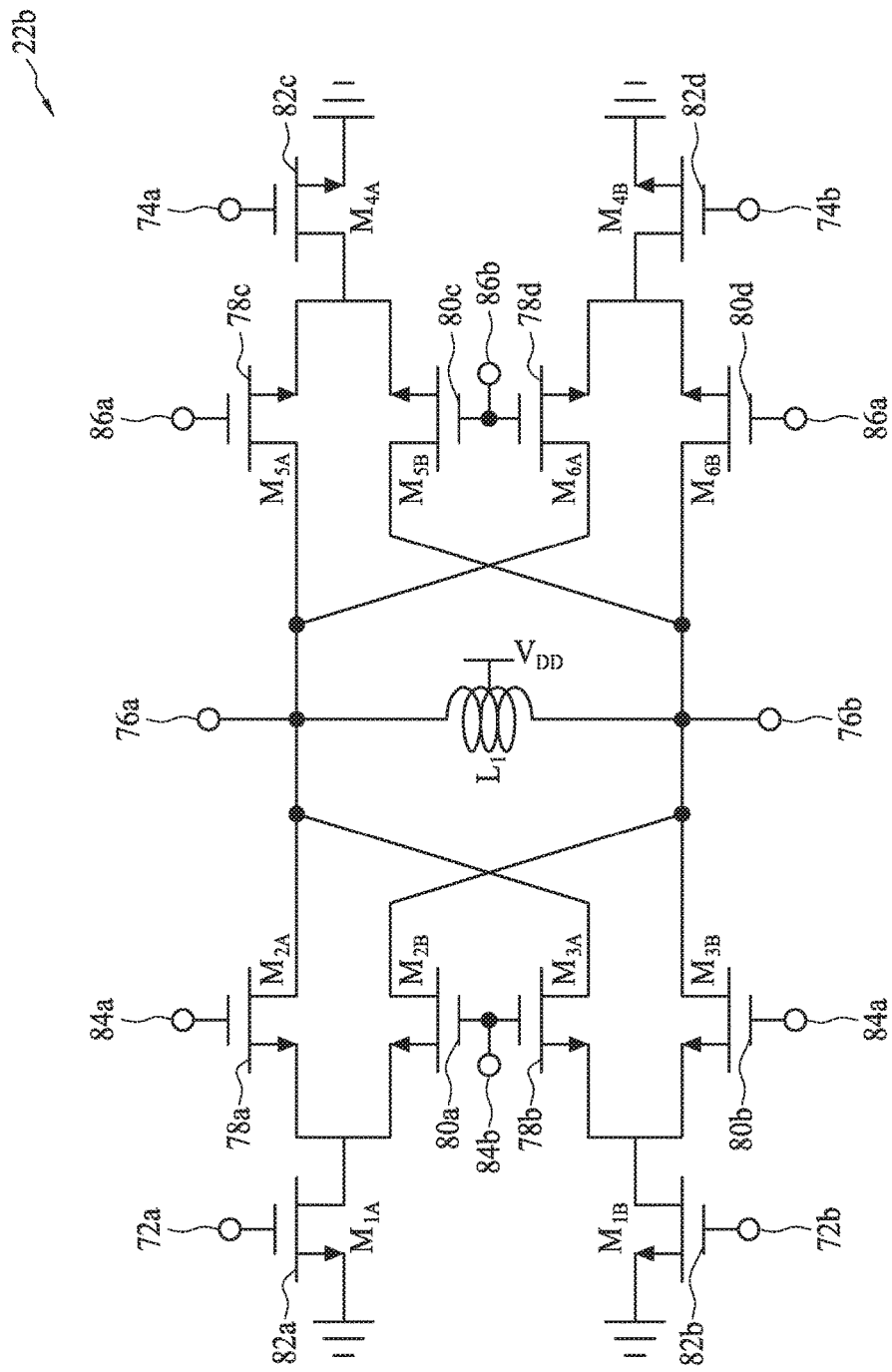
FIG. 9 illustrates an active I/Q up-converter mixer, in accordance with some embodiments.

In some embodiments, the mixer 22 is an I/Q up-conversion mixer. FIG. 8 illustrates a passive I/Q up-conversion mixer 22a, and FIG. 9 illustrates an active I/Q up-conversion mixer 22b, in accordance with some embodiments. Each of the passive I/Q up-conversion mixer 22a and the passive I/Q up-conversion mixer 22b is configured to receive a first set of inputs 72a-72b and a second set of inputs 74a-74b. In some embodiments, the first set of inputs 72a, 72b corresponds to in-phase (I) components of a received signal and the second set of inputs 74a, 74b correspond to quadrature (Q) components of the received signal. The I/Q up-conversion mixers 22a, 22b are configured to generate a positive RF output signal component 76a and a negative RF output signal component 76b in response to the received I/Q components 72a-74b.

In some embodiments, the passive I/Q up-conversion mixer 22a includes a set of first transistors 78a-78d (collectively "first set 78") and a set of second transistors 80a-80d (collectively "second set 80") coupled to each of the I component inputs 72a, 72b and the Q component inputs 74a, 74b. For example, as shown in FIG. 8, a first transistor 78a of the first set 78 and a first transistor 80a of the second set 80 each have a first drain/source terminal coupled to a positive I component input 72a. Similarly, a second transistor 78b from the first set and a second transistor 80b from the second set 80 each have a first drain/source terminal coupled to a negative I component input 72b. In some embodiments, each of the first transistors 78a-78d have a second drain/source terminal coupled to the positive RF output 76a, and each of the second transistors 80a-80d have a second drain/source terminal coupled to the negative RF output 76b. An inductor 82 is coupled between the positive RF output 76a and the negative RF output 76b.

In some embodiments, the gates of each of the first transistors 78a-78d and the second transistors 80a-80d are coupled to a local oscillator input 84a-86b associated with the positive and/or negative I/Q component 72a-74b. For example, in the illustrated embodiment, a first transistor 78a receives a positive I component input 72a at a first source/drain terminal and a positive local oscillator input 84a at a gate terminal. Similarly, a second transistor 80a receives a positive I component input 72a at a first source/drain terminal negative local oscillator input 84b at a gate terminal. The local oscillator inputs 84a-86b are configured to control operation of the respective transistors 78a-78d, 80a-80d to generate the RF outputs 76a, 76b.

The active I/Q up-conversion mixer 22b of FIG. 9 is similar to the passive I/Q up-conversion mixer 22a of FIG. 8, and similar description is not repeated herein. In some embodiments, the active I/Q up-conversion mixer 22b includes a set of third transistor 82a-82d coupled between the first and second transistors 78a-80d and the I/Q component inputs 72a-74b. In some embodiments, a gate of each of the transistors 82a-82d is coupled to one of the I/Q component inputs 72a-74b. For example, in the illustrated embodiment, a gate of a first transistor 82a is coupled to a positive I component input 72a, a gate of a second transistor 82b is coupled to a negative I component input 72b, a gate of a third transistor 82c is coupled to a positive Q component input 74a, and a gate of a fourth transistor 82d is coupled to a negative Q component input 74b. A first drain/source terminal of each of the transistors 82a-28d is coupled to a respective pair of the first set of transistors 78a-78d and the second set of transistor 80a-80d. A second drain/source terminal of each transistor 82a-82d is coupled to ground. In some embodiments, the inductor 82 is coupled to a voltage input 86. The voltage input provides an increased voltage across the inductor 82 as compared to the passive I/Q up-conversion mixer 22a of FIG. 8.

Figure 2:
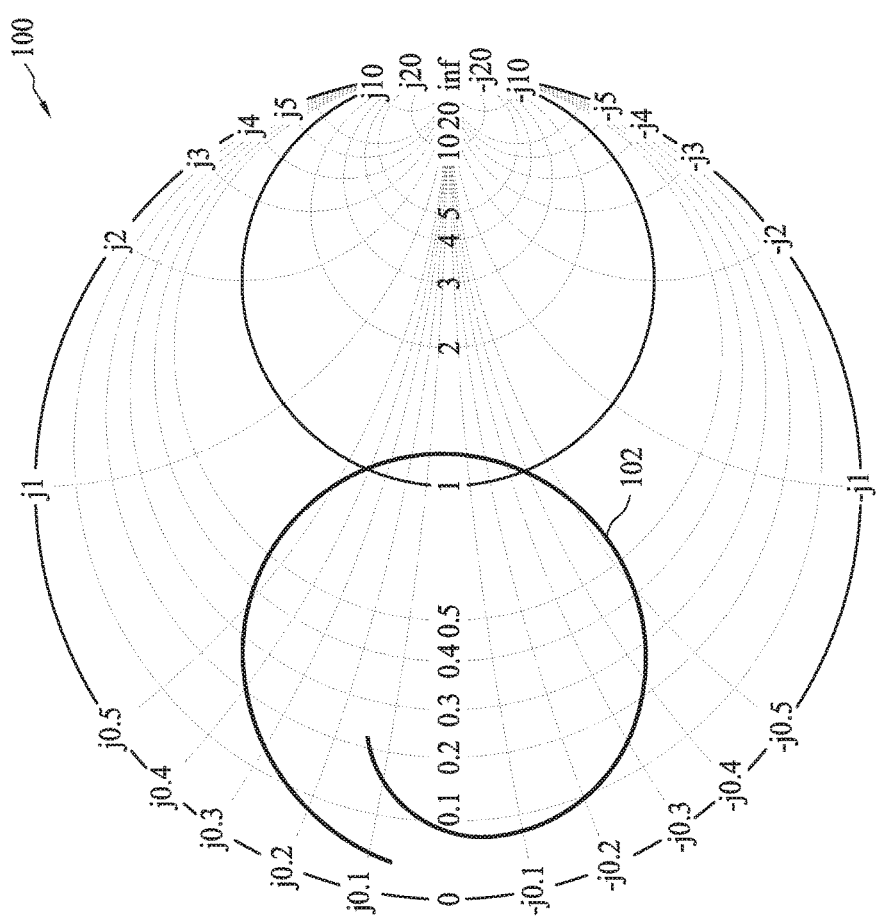
FIG. 2 is a graph illustrating output of the dual-mode TX frontend of FIG. 1 using a low-power path, in accordance with some embodiments.

FIG. 2 is a Smith graph 100 illustrating an impedance transformation of the BT/BLE frontend 2. As shown in FIG. 2, a constant standing wave ratio (SWR) 102 illustrates the increase in impedance of the BT/BLE signal from the first side 16a of the transformer to the second side 16b. The constant SWR 102 illustrates a complex relationship between the impedance of the first side 16a and the second side 16b. The position of the constant SWR 102 on the left-side of the Smith graph 100 indicates an increase in impedance from the first side 16a to the second side 16b of the BT/BLE frontend 2. The transformation causes attenuation of the signal, which is illustrated by the spiral path of the constant SWR 102.

Figure 3:
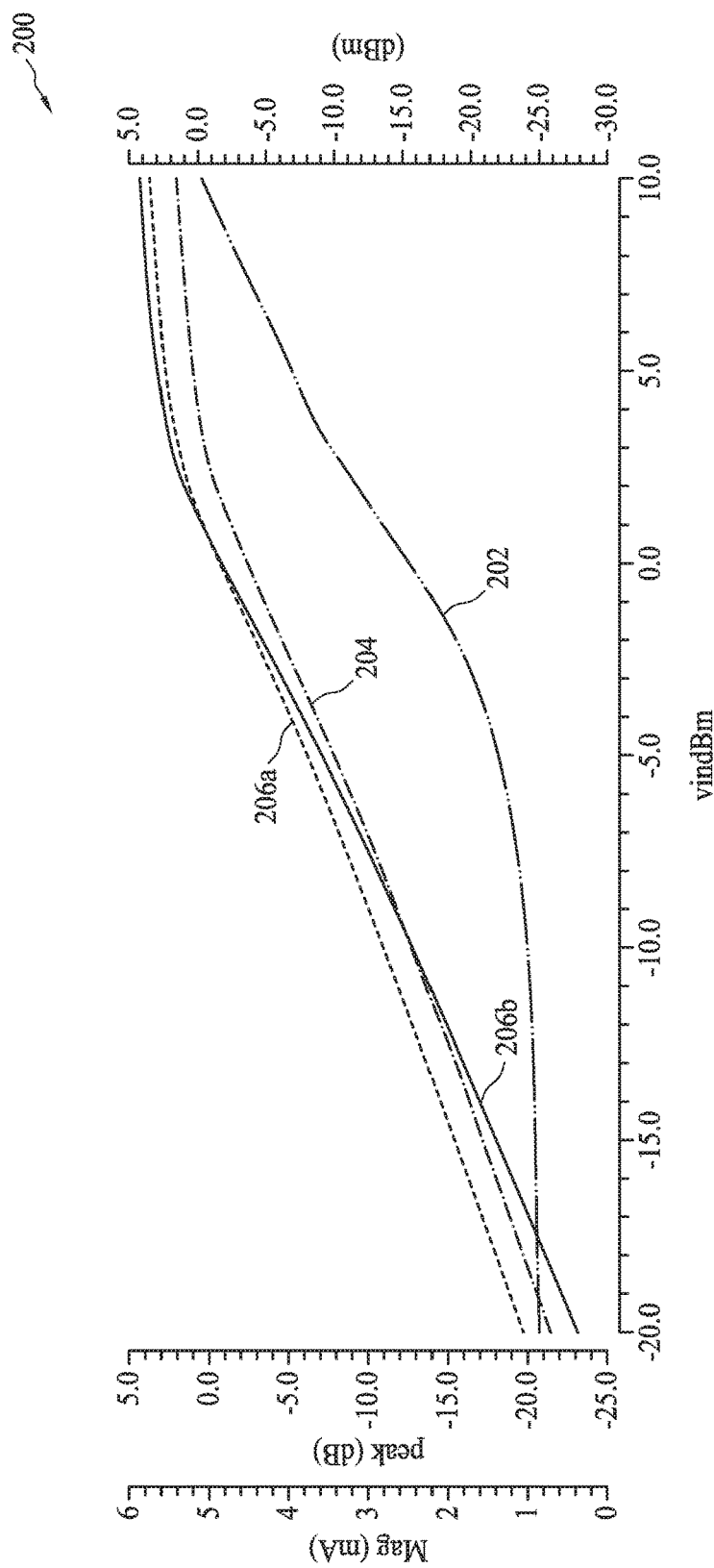
FIG. 3 is a graph illustrating a peak current of the dual-mode TX front end of FIG. 1 when transmitting a low-power signal, in accordance with some embodiments.

FIG. 3 is a graph 200 illustrating operation of one embodiment of a dual-mode RF TX frontend 2 during a low-power signal transmission, in accordance with some embodiments. The peak current 202 is plotted in mA against the antenna output 204 plotted in dBm, and the voltage draw 206a, 206b of the low-power path 6. The voltage draw 206a, 206b is shown as a power ratio (dBm) 206a and a voltage power (dbV) 206b. Each of the peak current 202, the antenna output 204, and the voltage draw 206 are plotted against the power input ($v_{in}$ dBm) of the dual-mode RF TX frontend 2. As shown in FIG. 3, in this embodiment, the low-power path 6 is configured to provide an amplification of 0 dBm (e.g., the low-power path has an amplifier 18 configured to act as a switch without amplifying the modulated signal received from the modulator) at a predetermined input voltage. The low-power amplifier 18 has a predetermined input voltage about 0.8 V, resulting in a peak current 202 of about 3.75 mA. The dual-mode RF TX frontend operates at about 33.3% efficiency during a low-power transmission. Similarly, in the illustrated embodiment, during a high-power signal transmission, the high-power path 4 is configured to provide an amplification of about 10 dBm. The high-power amplifier receives a predetermined input voltage of about 1.5 V, resulting in a peak current of about 22 mA. The dual-mode RF TX front end operates at about 30.3% efficiency during a high-power transmission. In some embodiments, the high-power transmission is a BT transmission and the low-power transmission is a BLE transmission.

Figure 4:
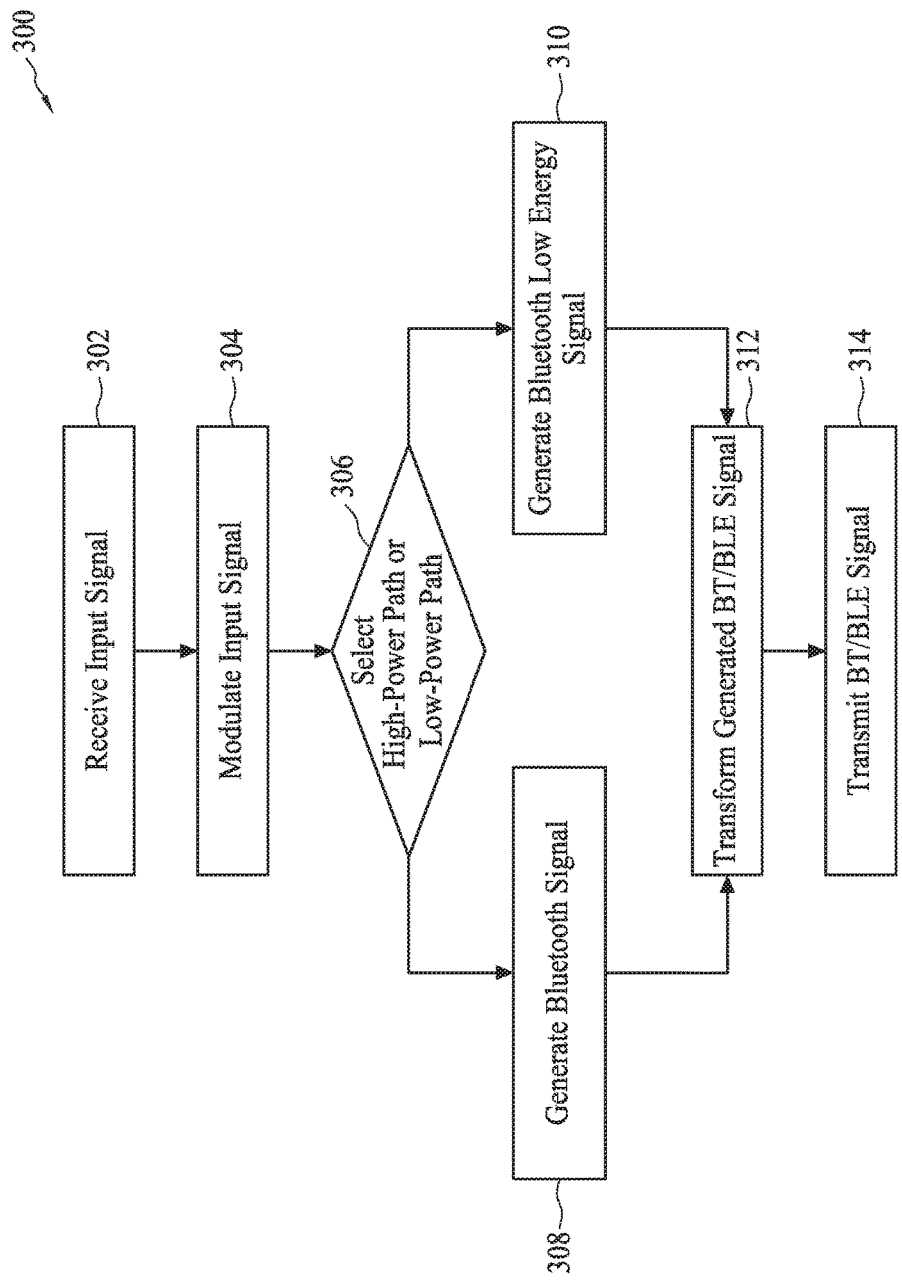
FIG. 4 is flowchart illustrating a method of operation of the dual-mode TX frontend of FIG. 1, in accordance with some embodiments.

FIG. 4 is a flowchart illustrating a method of operation 300 of the dual-mode RF TX frontend 2, in accordance with some embodiments. At a first step 302, an input signal is received at an input 8 of the dual-mode RF TX frontend 2. The input 8 can include an amplifier configured to amplify the received input signal to a first power level. At step 304, the input signal is modulated, for example, by a modulator 10. The input signal can be modulated using any suitable modulation, such as, for example, an amplitude-modulator, a quadrature modulator, a phase-shift keying modulator, a minimum shift keying modulator, a Gaussian frequency-shift keying modulator, a differential quadrature phase shift keying. (DQPSK) modulator, a π/4-DPQSK modulator, an 8 DPQSK modulator, and/or any other suitable modulator. In some embodiments, modulation of the input signal optionally includes mixing the input signal using a mixer 22 prior to modulation by the modulator 10 to modify the frequency of the input signal.

At step 306, one of a high-power path 4 or a low-power path 6 is selected. In some embodiments, the path 4, 6 is selected by providing input power to at least one circuit elements, such as an amplifier, in the one of the selected high-power path 4 or low-power path 6. For example, in some embodiments, the high-power path 4 includes a high-power amplifier 12. The high-power path 4 is selected by providing a first predetermined input voltage to the high-power amplifier 12. As another example, in some embodiments, the low-power path 6 includes a low-power amplifier 18. The low-power path 6 is selected by providing a second predetermined input voltage to the low-power amplifier 18. The second predetermined voltage is less than the first predetermined input voltage. In some embodiments, the high-power path 4 and/or the low-power path 6 can be selected using one or more additional circuit elements or signals, such as one or more switches, enable signals, variable power signals, and/or any other suitable control elements and/or signals.

If the high-power path 4 is selected at step 306, the modulated signal is provided to one or more circuit elements configured to generate a high-power signal at step 308. For example, in some embodiments, the high-power path 4 includes a high-power amplifier 12 configured to amplify the generated modulated signal to a power level suitable for transmission according to a first transmission protocol having a first power standard. In some embodiments, the high-power amplifier 12 has an amplification in a range of about 5 to 15 dBm, for example 10 dBm. If the low-power path 6 is selected at step 306, the modulated signal is provided to one or more circuit elements configured to generate a low-power signal at step 310. For example, in some embodiments, the low-power path 6 includes a low-power amplifier 18 configured to amplify the modulated signal to a power level suitable for transmission according to a second transmission protocol having a second power standard. The second power standard is less than the first power standard. In some embodiments, the second transmission protocol is a low-power version of the first transmission protocol. The low-power path 6 further includes an impedance modifier 20 configured to modify the impedance of a first side 16a of a transformer 16. In some embodiments, the low-power amplifier 18 has an amplification in a range of about −5 to 5 dBm, for example, 0 dBm, and passes the modulated signal from the modulator 10 to the transformer 16 at a constant power. Although embodiments are discussed herein including an amplification of the high-power path 4 of about 10 dBm and the lower path 6 of about 0 dBm, it will be appreciated that the high-power path 4 and/or the low power path 6 can include any suitable amplification range. For example, in some embodiments, the high power path 4 can include an amplification in a range of about 30 dBm to about 0 dBm, such as 25 dBm to 5 dBm, 20 dBm to 7 dBm, 15 dBm to 10 dBm, and/or any other suitable amplification. As another example, in some embodiments, the low power path 6 can include an amplification in a range of about 20 dBm to about −10 dBm, such as 15 dBm to −5 dBm, 10 dBm to −3 dBm, 4 dBm to 0 dBm, and/or any other suitable amplification or range of amplifications.

At step 312, a signal from the selected one of the high-power path 4 or the low-power path 6 is transformed to a frequency suitable for transmission in as a BT/BLE signal. In some embodiments, the signal is transformed by a transformer 16, such as a balun transformer. The transformer 16 includes a first impedance side 16a coupled to each of the high-power path 4 and the low-power path 6 and a second impedance side 16b coupled to an antenna.

At step 314, the high-power/low-power signal is transmitted by the antenna 14. In some embodiments, the antenna 14 is configured to transmit the high-power/low-power signal at any suitable frequency, such as a frequency shared by each of the first transmission protocol and the second transmission protocol. For example, in some embodiments, the first transmission protocol is a BT protocol and the second transmission protocol is BLE protocol. The power of the transmitted signal is determined by the selection of one of the high-power path 4 or the low-power path 6.

Figure 5:
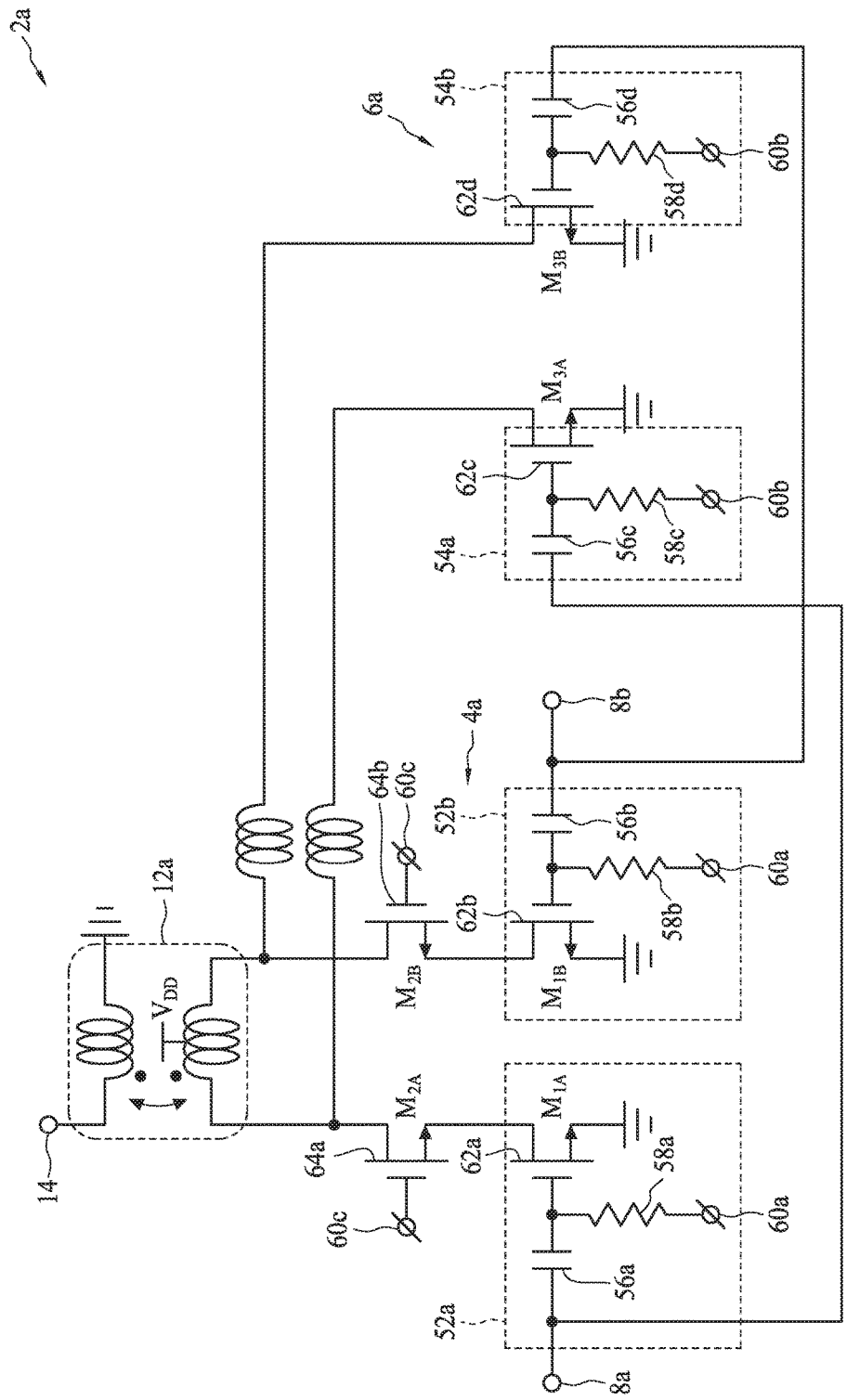
FIG. 5 illustrates a dual-mode TX frontend including a first, high-power transmission path and a second, low-power transmission path, in accordance with some embodiments.

FIG. 5 illustrates a dual-mode TX frontend 2a including a first signal path 4a and a second signal path 6a, in accordance with some embodiments. The first signal path 4a is a high power signal path and the second signal path 6a is a low-power signal path. The dual-mode TX frontend 2a receives a positive input signal at a first input 8a and a negative input signal at a second input 8b. The positive and/or negative input signals can be generated by one or more additional circuits and/or circuit elements, such as, for example, a mixer 22, 22a, 22b as illustrated in FIGS. 1, 8, and 9, respectively.

In some embodiments, the first input 8a is coupled to a first high-power selection circuit 52a and a first low-power selection circuit 54a and the second input 8b is coupled to a second high-power selection circuit 52b and a second low-power selection circuit 54b. Each of the high-power selection circuits 52a, 52b and the low-power selection circuits 54a, 54b includes a capacitor 56a-56d, a resistor 58a-58d coupled between the capacitor 56a-56d and a voltage input 60a, 60b, and a switch element 62a-62d. The capacitor 56a-56d and the resistor 58a-5a8d associated with each switch element 62a-62d provide a predetermined response for each of the selection circuits 52a-54b.

For example, in some embodiments, each of the high-power selection circuits 52a, 52b are coupled to a first voltage input 60a. When the first voltage input 60a is set to a predetermined value, the capacitors 56a, 56b associated with the high power selection circuits 52a, 52b are charged, connecting the switch elements 62a, 62b of the high power selection circuits 52a, 52b to respective positive and negative RF inputs 8a, 8b. Similarly, in some embodiments, each of the low-power selection circuits 54a, 54b are coupled to a second voltage input 60b. When the second voltage input 60b is set to a predetermined value, the capacitors 56c, 56d associated with the low-power selection circuits 54a, 54b are charged, connecting the switch elements 62c, 62d of the low-power selection circuits 54a, 54b to respective positive and negative RF inputs 8a, 8b.

Figure 6:
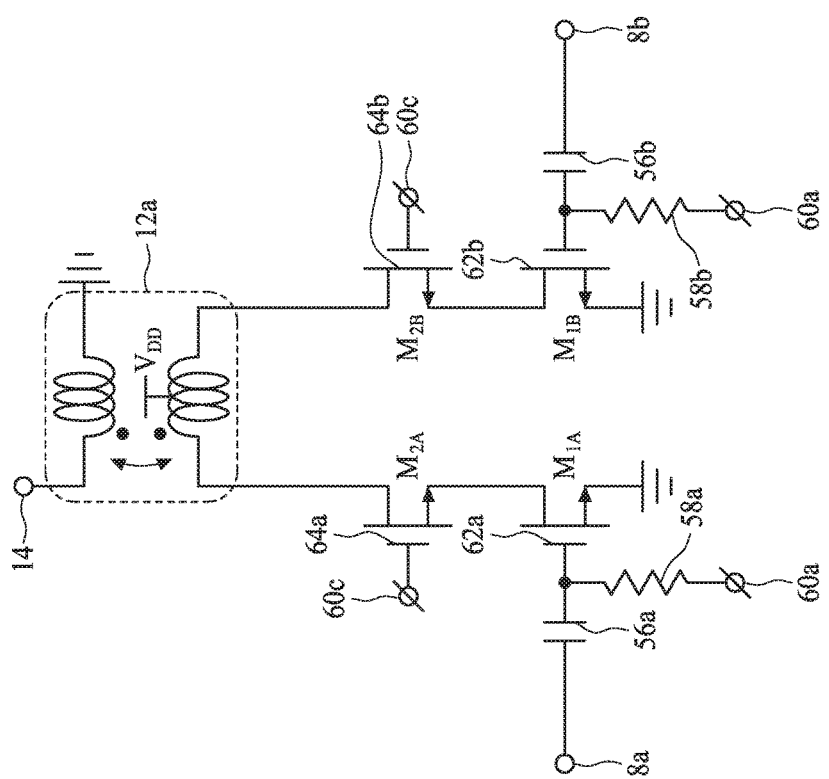
FIG. 6 illustrates the dual-mode TX frontend of FIG. 5 configured for a high-power transmission using the first transmission path.

FIG. 6 illustrates the dual-mode TX frontend 2a configured to transmit a signal using the high-power transmission path 4a, in accordance with some embodiments. The low-power path 6a (which is not selected) is greyed out to indicate that the low-power path 6a is not active in this configuration. In the illustrated embodiment, the first voltage input 60a is set to a predetermined value to charge the first and second capacitors 56a, 56ba associated with each of the first switch element 62a and the second switch element 62b. After the first and second capacitors 56a, 56b are charged, the gates of each of the switch elements 62a, 62b are coupled to respective RF inputs 8a, 8b. An RF signal received at each of the RF inputs 8a, 8b acts as a control signal for the switch elements 62a, 62b. The switch elements 62a, 62b control a high-power amplifier 12a including a second set of transistor elements 64a, 64b. When the second set of transistor elements 64a, 64b are activated, an oscillating high-power transmission voltage is provided across a first side 16a of a transformer 16. For example, when the RF input signal is positive, the first switch element 64a is on, which turns on the first transistor element 64a of the high-power amplifier 12a. The first transistor element 64a provides a positive amplified signal on the first side 16a of the transformer 16. Similarly, when the RF signal is negative, the second switch element 64b is on, which turns on the second transistor element 64b of the high power amplifiers 12a. The second transistor element 64b provides a negative amplified signal on the first side 16a of the transformer 16.

Figure 7:
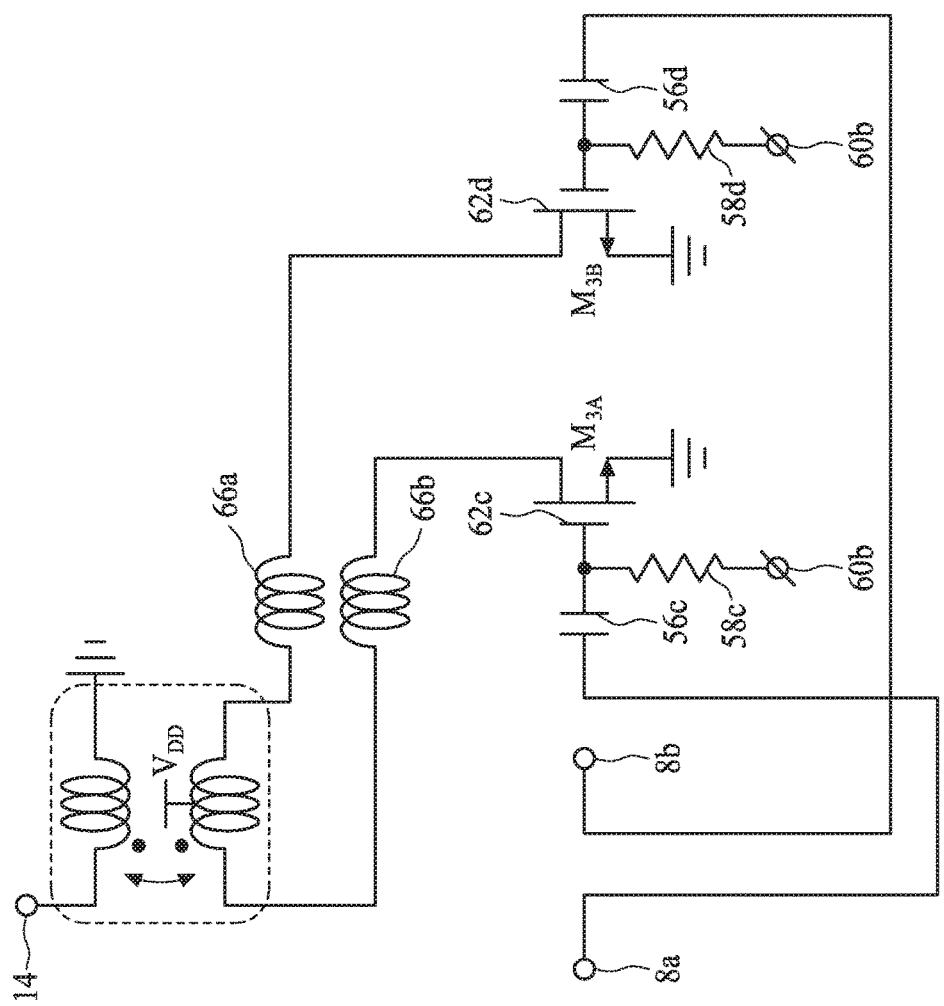
FIG. 7 illustrates the dual-mode TX frontend of FIG. 5 configured for a low-power transmission using the second transmission path.

FIG. 7 illustrates the dual-mode TX frontend 2a of FIG. 5 configured to transmit a signal using the low-power transmission path 6a, in accordance with some embodiments. The high-power transmission path 4a is shown greyed out, as the high-powered transmission path 4a is not active in this configuration. In the illustrated embodiment, the second voltage 60b is set to a predetermined value to charge the third and fourth capacitors 56c, 56d associated with each of the third switch element 62c and the fourth switch element 62d. After the capacitors 56c, 56d are charged, the gates of each of the switch elements 62c, 62d are coupled to the respective RF inputs 8a, 8b. An RF signal received at the RF inputs 8a, 8b acts as a control signal for switch elements 62c, 62d. The switch elements 62c, 62d are configured to pass the RF input signal received at RF inputs 8a, 8b to a first impedance booster 66a coupled to the third switch element 62c and a second impedance booster 66b coupled to the fourth switch element 62d. The impedance boosters 66a, 66b adjust the impedance of the RF input signal prior to the RF input signal being provided to the transformer 16. In some embodiments, the impedance boosters 66a, 66b include inductors.

In some embodiments, a transmission frontend is disclosed. The transmission frontend includes a modulator configured to generate a modulated signal. A first selectable path is electrically coupled to the modulator and is configured to generate a first signal having a first power level. A second selectable path is electrically coupled to the modulator and is configured to generate a second signal having a second power level. The first power level is greater than the second power level. A transformer is electrically coupled to each of the first selectable path and the second selectable path. An antenna is electrically coupled to the transformer.

In some embodiments, a transmitter is disclosed. The transmitter includes a first selectable path configured to receive a modulated signal and a second selectable path configured to receive the modulated signal. The first selectable path includes a first amplifier configured to amplify the modulated signal from a first power level to a second power level. The first amplifier is configured to receive a first signal for selecting the first selectable path. The second selectable path is configured to amplify the modulated signal from the first power level to a third power level. The second power level is greater than the third power level. The second amplifier is configured to receive a second signal for selecting the second selectable path. A transformer is electrically coupled to each of the first selectable path and the second selectable path. The transformer is configured to receive the modulated signal from one of the first selectable path or the second selectable path if selected. An antenna is electrically coupled to the transformer.

In some embodiments, a method of transmission is disclosed. The method includes the steps of receiving an input signal, modulating the input signal to generate a modulated signal, selecting one of a high-power selectable path or a low-power selectable path, generating an amplified signal using the selected one of the high-power selectable path or the low-power selectable path, transforming the amplified signal to a transmission signal having a frequency within a predetermined frequency range, and transmitting the transmission signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A transmission frontend, comprising:
a modulator configured to generate a modulated signal;
a first selectable path electrically coupled to the modulator, wherein the first selectable path is configured to generate a first signal having a first power level;
a second selectable path electrically coupled to the modulator, wherein the second selectable path is configured to generate a second signal having a second power level, wherein the first power level is greater than the second power level, and wherein the second selectable path includes an impedance booster; and
a transformer electrically coupled to each of the first selectable path and the second selectable path, wherein the impedance booster is configured to increase an impedance on a first side of the transformer when the second selectable path is selected; and
an antenna electrically coupled to the transformer.

2. The transmission frontend of claim 1, wherein the first selectable path includes a first amplifier configured to provide a first amplification and the second selectable path includes a second amplifier configured to provide a second amplification, wherein the first amplification is greater than the second amplification.

3. The transmission frontend of claim 2, wherein first amplification is in a range of 5 to 15 dBm.

4. The transmission frontend of claim 2, wherein the second amplification is in a range of −5 to 5 dBm.

5. The transmission frontend of claim 2, wherein the first selectable path is selected by providing the first amplifier with a first voltage and the second selectable path is selected by providing the second amplifier with a second voltage.

6. The transmission frontend of claim 1, wherein the impedance booster includes at least one inductor electrically coupled to the transformer.

7. The transmission frontend of claim 1, comprising a mixer electrically coupled to the modulator.

8. The transmission frontend of claim 7, wherein the mixer is configured to convert the input signal from a first frequency to a second frequency.

9. The transmission frontend of claim 1, wherein the transformer comprises a balun transformer.

10. The transmission frontend of claim 1, wherein the first signal corresponds to a high-power implementation of a transmission protocol and the second signal corresponds to a low-power implementation of the transmission protocol.

11. The transmission frontend of claim 1, wherein the modulator comprises a quadrature amplitude modulator.

12. A transmitter, comprising:
a first selectable path configured to receive a modulated signal, wherein the first selectable path includes a first amplifier configured to amplify the modulated signal from a first power level to a second power level, and wherein the first amplifier is configured to receive a first signal for selecting the first selectable path;

a second selectable path configured to receive the modulated signal, wherein the second selectable path includes a second amplifier configured to amplify the modulated signal from the first power level to a third power level, wherein the second power level is greater than the third power level, and wherein the second amplifier is configured to receive a second signal for selecting the second selectable path, and wherein the second selectable path includes an impedance booster;

a transformer electrically coupled to each of the first selectable path and the second selectable path, the transformer configured to receive the modulated signal from one of the first selectable path or the second selectable path if selected, wherein the impedance booster is configured to increase an impedance on a first side of the transformer when the second selectable path is selected; and an antenna coupled to the transformer.

13. The transmitter of claim 12, wherein first amplifier is configured to provide an amplification in a range of 5-15 dBm.

14. The transmitter of claim 12, wherein the second amplifier is configured to provide an amplification in a range of −5 to 5 dBm.

15. The transmitter of claim 12, wherein the first selectable path is selected by setting the first signal to a first predetermined voltage level and the second signal to zero voltage, and wherein the second selectable path is selected by setting the second signal to a second predetermined voltage level and the first signal to zero voltage.

16. The transmitter of claim 12, wherein the impedance booster includes at least one inductor electrically coupled to the transformer.

17. The transmitter of claim 12, wherein the first signal corresponds to a high-power implementation of a predetermined transmission protocol and the second signal corresponds to a low-power implementation of the predetermined transmission protocol.

18. A method of transmission, comprising:
receiving an input signal;
modulating the input signal to generate a modulated signal;
selecting one of a high-power selectable path or a low-power selectable path;
generating an amplified signal using the selected one of the high-power selectable path or the low-power selectable path;
increasing an impedance on a first side of a transformer when the low-power selectable path is selected;
transforming the amplified signal to a transmission signal having a frequency within a predetermined frequency range; and
transmitting the transmission signal.

* * * * *